United States Patent
Kim et al.

(10) Patent No.: US 10,672,923 B2
(45) Date of Patent: Jun. 2, 2020

(54) FRONT ELECTRODE FOR SOLAR CELL AND SOLAR CELL INCLUDING THE SAME

(71) Applicant: SAMSUNG SDI CO., LTD., Yongin-si, Gyeonggi-do (KR)

(72) Inventors: Dong Suk Kim, Suwon-si (KR); Hee In Nam, Suwon-si (KR); Sang Hee Park, Suwon-si (KR); Seok Hyun Jung, Suwon-si (KR); Jae Hwi Cho, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 109 days.

(21) Appl. No.: 15/661,465

(22) Filed: Jul. 27, 2017

(65) Prior Publication Data

US 2018/0047859 A1    Feb. 15, 2018

(30) Foreign Application Priority Data

Aug. 12, 2016    (KR) ........................ 10-2016-0103293

(51) Int. Cl.
*H01L 31/0224*    (2006.01)

(52) U.S. Cl.
CPC ............ *H01L 31/022425* (2013.01); *H01L 31/022433* (2013.01); *H01L 31/022466* (2013.01); *Y02E 10/50* (2013.01)

(58) Field of Classification Search
None
See application file for complete search history.

(56) References Cited

U.S. PATENT DOCUMENTS

| 2004/0265690 A1 | 12/2004 | Chen |
| 2012/0313198 A1* | 12/2012 | Ittel ........................ C03C 8/02 257/431 |

FOREIGN PATENT DOCUMENTS

| CN | 102097518 A | 6/2011 |
| CN | 103094368 A | 5/2013 |
| CN | 104123975 A | 10/2014 |
| CN | 104409637 A | 3/2015 |
| CN | 104638032 A | 5/2015 |
| CN | 105393376 A | 3/2016 |
| JP | 5450294 B2 | 3/2014 |
| KR | 10-2009-0079909 A | 7/2009 |
| KR | 10-2014-0127938 A | 11/2014 |

(Continued)

OTHER PUBLICATIONS

Machine Translation XIPING CN 104638032, accessed Jan. 7, 2019 (Year: 2015).*

(Continued)

*Primary Examiner* — Shannon M Gardner
(74) *Attorney, Agent, or Firm* — Lee IP Law, P.C.

(57) ABSTRACT

A front electrode for solar cells and a solar cell, the front electrode including a stepped structure at an outermost surface thereof, wherein the stepped structure is composed of n stages, in which n is an integer of 3 or greater, and an $n^{th}$ stage has a smaller cross-sectional area than an $(n-1)^{th}$ stage such that the $(n-1)^{th}$ stage is partially exposed, and the stepped structure occupies about 5% to about 100% of a total surface area of the outermost surface.

8 Claims, 6 Drawing Sheets

(56) References Cited

FOREIGN PATENT DOCUMENTS

| KR | 10-2014-0127947 A | 11/2014 |
|---|---|---|
| TW | M387372 U | 8/2010 |
| TW | 201227997 A | 7/2012 |

OTHER PUBLICATIONS

Gangopadhyay, Front Grid Design for Plated Contact Solar Cells, Conference Record of the Twenty-Ninth IEEE PV Specialists Conference, 2002 (Year: 2002).*
Office Actions dated Nov. 19, 2018 in the corresponding Chinese Patent Application No. 201710653889.7.
Office Actions dated Nov. 22, 2018 in the corresponding Korean Patent Application No. 10-2016-0103293.
Office Action dated May 24, 2018 in the corresponding Korean Patent Application No. 10-2016-0103293.
Office Action dated May 28, 2018 in the corresponding Taiwanese Patent Application No. 106125240.

\* cited by examiner

FRONT ELECTRODE FOR SOLAR CELL AND SOLAR CELL INCLUDING THE SAME

CROSS-REFERENCE TO RELATED APPLICATION

Korean Patent Application No. 10-2016-0103293, filed on Aug. 12, 2016 in the Korean Intellectual Property Office, and entitled: "Front Electrode for Solar Cell and Solar Cell Comprising the Same," is incorporated by reference herein in its entirety.

BACKGROUND

1. Field

Embodiments relate to a front electrode for solar cells and a solar cell including the same.

2. Description of Related Art

Solar cells generate electricity using the photovoltaic effect of a p-n junction, which converts photons (e.g., of sunlight) into electricity. In the solar cell, front and rear electrodes may be formed on upper and lower surfaces of a semiconductor wafer or substrate with the p-n junctions, respectively. Then, the photovoltaic effect at the p-n junction may be induced by light, e.g., sunlight, entering the semiconductor wafer and electrons generated by the photovoltaic effect at the p-n junction may provide electric current through the electrodes.

Electrodes of a solar cell may be formed on a wafer by applying, patterning, and baking an electrode paste including a conductive powder, glass frits, and an organic vehicle.

SUMMARY

Embodiments are directed to a front electrode for solar cells and a solar cell including the same.

The embodiments may be realized by providing a front electrode for solar cells, the front electrode including a stepped structure at an outermost surface thereof, wherein the stepped structure is composed of n stages, in which n is an integer of 3 or greater, and an $n^{th}$ stage has a smaller cross-sectional area than an $(n-1)^{th}$ stage such that the $(n-1)^{th}$ stage is partially exposed, and the stepped structure occupies about 5% to about 100% of a total surface area of the outermost surface.

Each stage of the stepped structure may at least partially include a prismatic structure.

The stepped structure may have a silver content of about 50 wt % to about 100 wt %.

The front electrode may be formed by baking a composition that includes silver powder, a glass frit, and an organic vehicle.

The glass frit may include tellurium.

The composition may include about 60 wt % to about 95 wt % of the silver powder, about 0.1 wt % to about 20 wt % of the glass fit, and about 1 wt % to about 30 wt % of the organic vehicle.

The composition may further include a dispersant, a thixotropic agent, a plasticizer, a viscosity stabilizer, an anti-foaming agent, a pigment, a UV stabilizer, an antioxidant, or a coupling agent.

Baking may be performed at a temperature of about 600° C. to about 1,000° C.

The embodiments may be realized by providing a solar cell including the front electrode for solar cells according to an embodiment.

BRIEF DESCRIPTION OF DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

The embodiments may provide a front electrode for solar cells having excellent electrical properties and adhesion to a ribbon. For example, it is possible to achieve remarkable improvement in adhesive strength of the front electrode to the ribbon through control of morphology of an outermost surface of the front electrode in a specific manner without adding additional components to an electrode composition.

In some front electrodes for solar cells fabricated by baking an electrode composition, silver powder may be sintered in liquid phase to form the electrode. Thus, the electrode may have a curved surface similar to hardened lava. According to an embodiment, when an electrode composition including specific compositions is subjected to baking under specific conditions, a front electrode having a stepped structure may be formed through partial crystallization of silver powder during baking. Without being bound by theory, over-baking of the electrode composition may cause the silver powder to partially crystallize and form the stepped multilayer structure during the baking process.

In addition, the front electrode having the stepped structure on the surface thereof according to an embodiment may exhibit significant improvement in adhesion to a ribbon, as compared with a front electrode having a surface of an amorphous curved structure. Further, the front electrode according to an embodiment may exhibit improved adhesion through adjustment of surface morphology thereof without using any additional components and may thus exhibit excellent electrical properties.

Front Electrode for Solar Cells

The front electrode for solar cells according to an embodiment may include a stepped structure on an outermost surface thereof. In an implementation, the stepped structure may be a multilayer structure composed of n stages (wherein n is an integer of 3 or greater), in which an $n^{th}$ stage has a smaller cross-sectional area than an $(n-1)^{th}$ stage such that the $(n-1)^{th}$ stage is partially exposed.

Figure 1A:
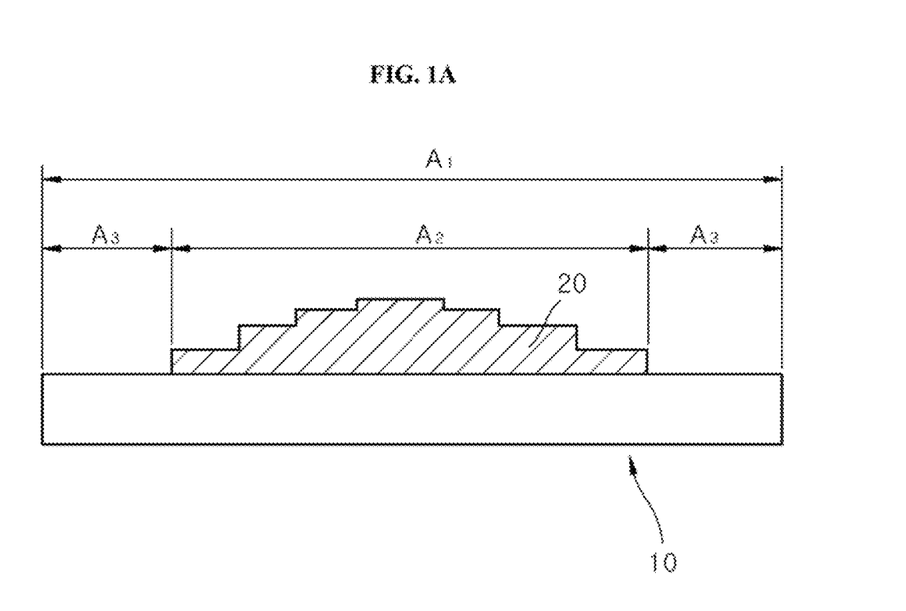
FIG. 1A illustrates a schematic sectional view of a front electrode for solar cells and FIG. 1B illustrates a schematic plan view of the front electrode for solar cells.
Figure 1B:
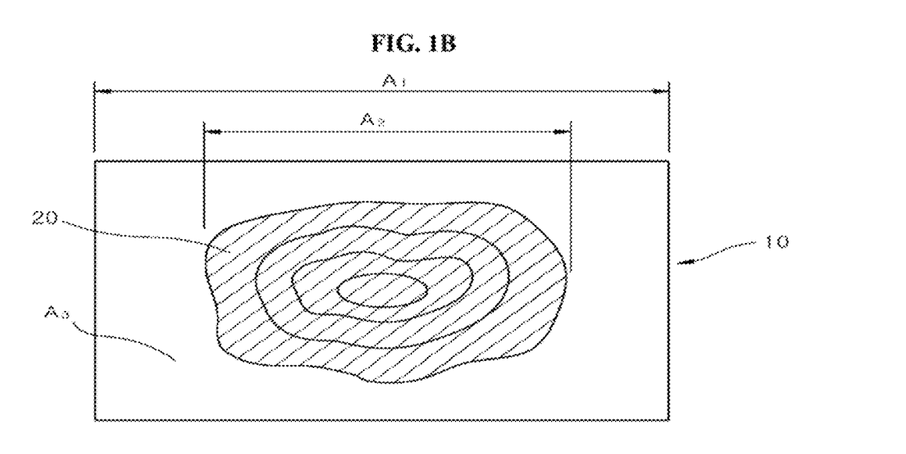
Figure 2:
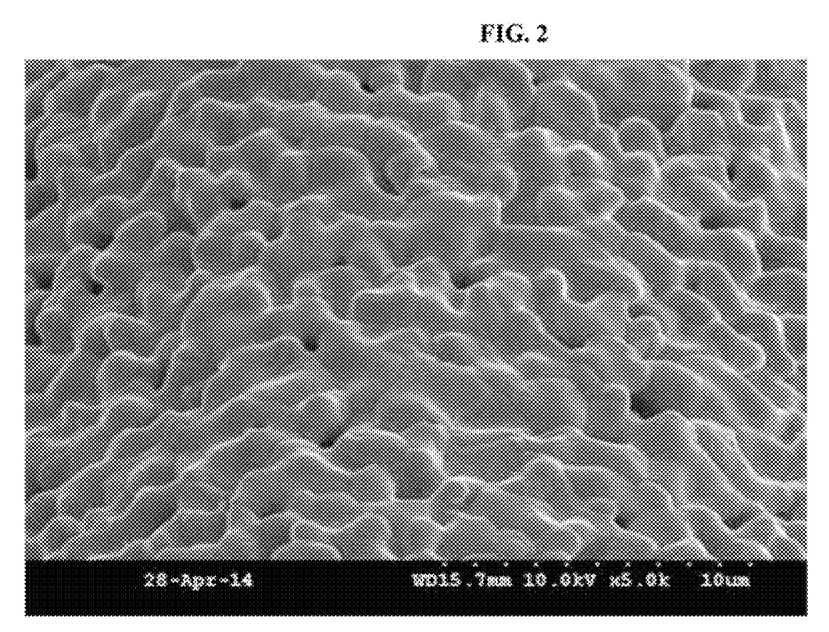
FIG. 2 illustrates a scanning electron micrograph (SEM) image showing surface morphology of a front electrode fabricated in Example 1.
Figure 3:
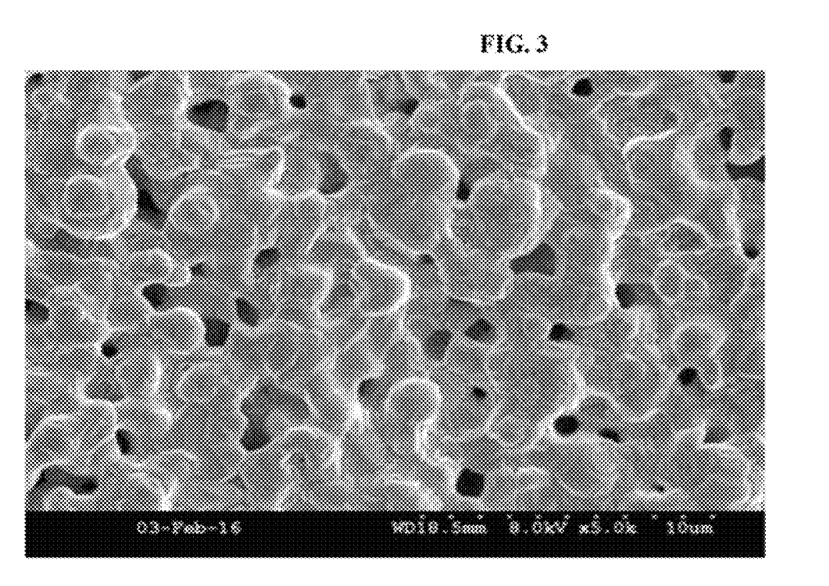
FIG. 3 illustrates an SEM image showing surface morphology of a front electrode fabricated in Example 2.
Figure 4:
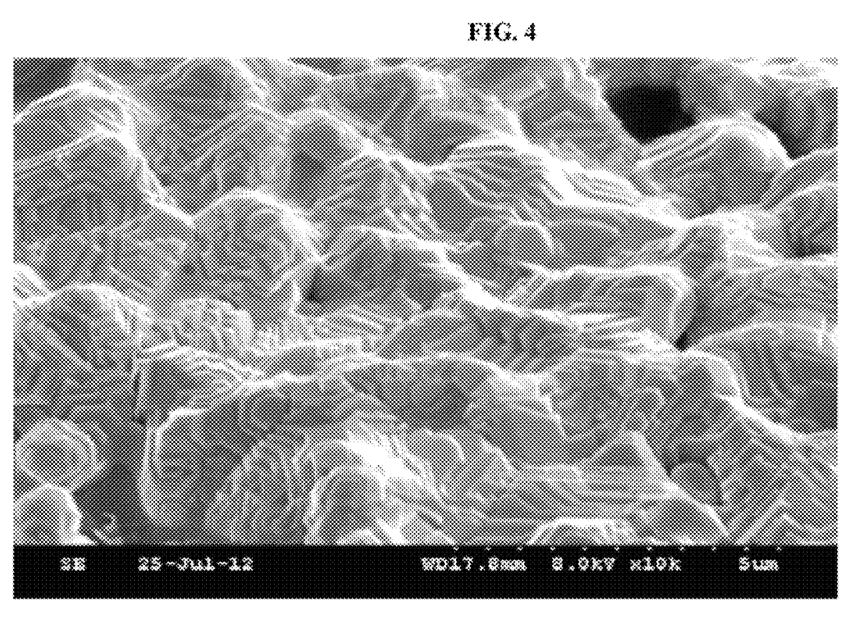
FIG. 4 illustrates an SEM image showing surface morphology of a front electrode fabricated in Example 3.
Figure 5:
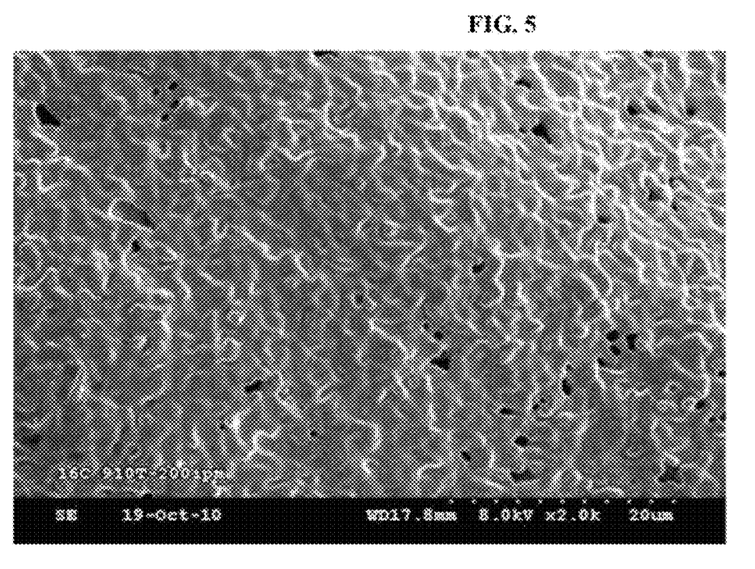
FIG. 5 illustrates an SEM image showing surface morphology of a front electrode fabricated in Comparative Example 1.
Figure 6:
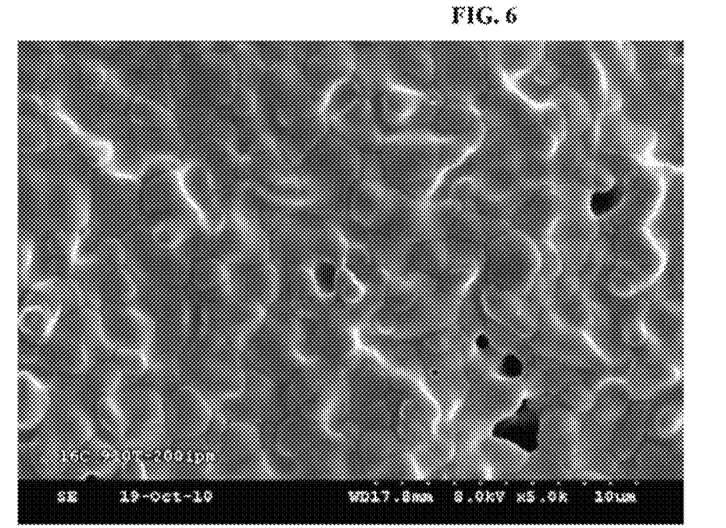
FIG. 6 illustrates an SEM image showing surface morphology of a front electrode fabricated in Comparative Example 2.
Figure 7:
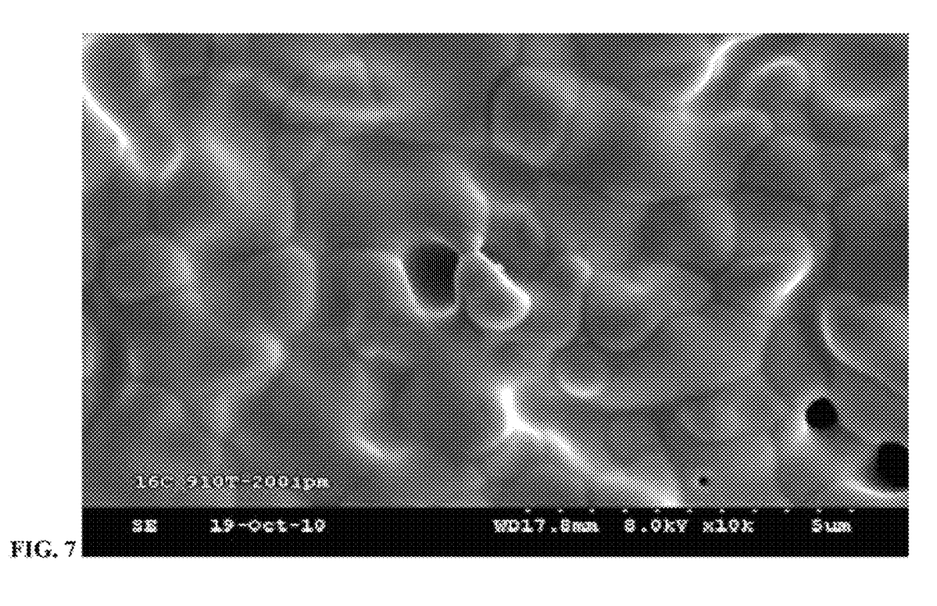
FIG. 7 illustrates an SEM image showing surface morphology of a front electrode fabricated in Comparative Example 3.
Figure 8:
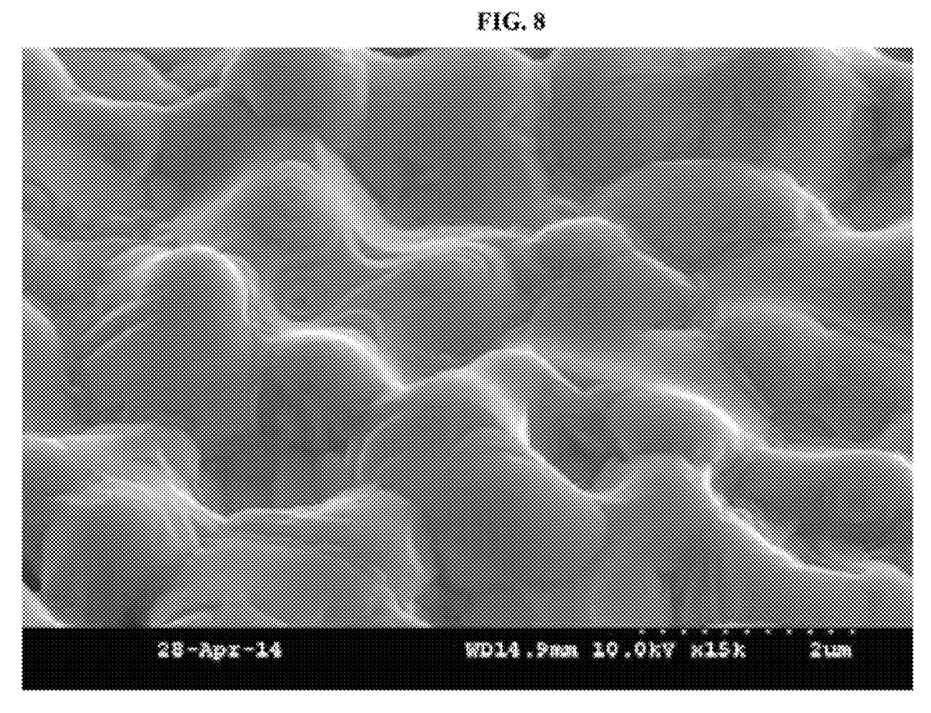
FIG. 8 illustrates an SEM image showing surface morphology of a front electrode fabricated in Comparative Example 4.

FIG. 1A illustrates a schematic sectional view of the front electrode for solar cells and FIG. 1B illustrates a schematic plan view of the front electrode for solar cells. Referring to FIGS. 1A and 1B, the front electrode 23 may have a stepped structure 20 formed on or at the outermost surface thereof. For example, the front electrode 23 may have a front surface formed as a stepped structure 20 or the front electrode 23 may include a stepped structure 20 forming an outermost surface of the front electrode 23.

Each stage of the stepped structure may at least partially include a prismatic structure. Herein, the prismatic structure refers to a structure in which two surfaces form a predetermined angle, different from a curved figure or curved surface such as a cylinder, a sphere, an elliptical column, and the like. In an implementation, in the prismatic structure, the angle formed by the two surfaces may be, e.g., an acute angle, a right angle, or an obtuse angle. For example, adjacent planar surfaces of the stepped structure may meet at an angle.

Referring to FIGS. 1A and 1B, a total surface area A1 of an outermost surface of the front electrode may be a sum of the area A2 occupied by the stepped structure and the area A3 without (e.g., outside or surrounding) the stepped structure. The area A2 occupied by the stepped structure may be the horizontal projection area (or occupied area) when viewed in the vertical direction of the front electrode.

In the front electrode according to an embodiment, the area occupied by the stepped structure (hereinafter, "occupied area") may be, e.g., about 5% to about 100% of a total area of the outermost surface. In an implementation, the occupied area may be, e.g., about 15% to about 100% or about 20% to about 100%. Maintaining the occupied area at about 5% or greater may help ensure that the front electrode exhibits significant improvement in adhesion to a substrate. In an implementation, the occupied area may be measured using the Image Pro Plus program available from Media Cybernetics, Inc. In an implementation, in the front electrode, the occupied area may be, e.g., about 5%, 6%, 7%, 8%, 9%, 10%, 11%, 12%, 13%, 14%, 15%, 16%. 17%. 18%. 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, 99%, or 100% of the total area of the outermost surface.

The stepped structure may be formed by baking silver powder (e.g., silver-containing powder) of an electrode composition and essentially consists of silver (Ag). In an implementation, the stepped structure may have a silver content of about 50 wt % to about 100 wt %, e.g., about 80 wt % to about 100 wt %, or about 90 wt % to about 100 wt %. In an implementation, the stepped structure may have a silver content of, e.g., about 50 wt %, 51 wt %, 52 wt %, 53 wt %, 54 wt %, 55 wt %, 56 wt %, 57 wt %, 58 wt %, 59 wt %, 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %; 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, 95 wt %, 96 wt %, 97 wt %, 98 wt %, 99 wt %, or 100 wt %.

The front electrode according to an embodiment may be formed by baking a composition including silver powder, a glass frit, and an organic vehicle.

The silver powder may impart electrical conductivity to the electrode. The silver powder may have a nanometer or micrometer-scale particle size. In an implementation, the silver powder may have a particle size of dozens to several hundred nanometers, or a particle diameter of several to dozens of micrometers. In an implementation, the silver powder may be a mixture of two or more types of silver powder having different particle sizes.

In an implementation, the silver powder may have various particle shapes, e.g., a spherical, flake or amorphous shape.

In an implementation, the silver powder may have an average particle diameter (D50) of about 0.1 μm to about 10 μm, e.g., about 0.5 μm to about 5 μm. Within this range of average particle diameter, the composition may help reduce contact resistance and line resistance of a solar cell. The average particle diameter may be measured using, e.g., a Model 1064D (CILAS Co., Ltd.) after dispersing the silver powder in isopropyl alcohol (IPA) at 25° C. for 3 minutes via ultrasonication.

The silver powder may be present in an amount of, e.g., about 60 wt % to about 95 wt %, based on a total weight of the composition. Within this range, the composition may help improve conversion efficiency of a solar cell and may be easily prepared in paste form. In an implementation, the silver powder may be present in an amount of, e.g., about 70 wt % to about 90 wt % based on the total weight of the composition. In an implementation, the silver powder may be present in an amount of, e.g., about 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %. 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, or 95 wt %, based on the total weight of the composition.

The glass frit may form silver crystal grains in an emitter region by etching an anti-reflection layer and melting the silver powder during a baking process of the composition for solar cell electrodes.

The glass frit may include a suitable glass frit. In an implementation, the glass frit may be a tellurium glass frit including tellurium.

In an implementation, the glass frit may further include at least one of bismuth, lead, lithium, sodium, zinc, tungsten, silicon, and magnesium.

The glass frit may be prepared by a suitable method. In an implementation, the glass frit may be prepared by mixing the aforementioned components using a ball mill or a planetary mill, melting the mixture at about 900° C. to about 1,300° C., and quenching the melted mixture to 25° C., followed by pulverizing the obtained product using a disk mill, a planetary mill or the like.

In an implementation, the glass frit may have an average particle diameter (D50) of, e.g., about 0.1 μm to about 10 μm. In an implementation, the glass frit may have various shapes, e.g., a spherical or amorphous shape.

In an implementation, the glass frit may be present in an amount of about 0.5 wt % to about 20 wt %, e.g., about 3 wt % to about 15 wt %, based on the total weight of the composition for solar cell electrodes. Within this range, the glass frit may help secure stability of a p-n junction under various sheet resistances, minimize resistance, and ultimately improve solar cell efficiency. In an implementation, the glass fit may be present in an amount of, e.g., about 0.5 wt %, 1 wt %, 1.5 wt %, 2 wt %, 2.5 wt %, 3 wt %, 3.5 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %, based on the total weight of the composition for solar cell electrodes.

The organic vehicle may help impart suitable viscosity and rheological characteristics for printing to the composition for solar cell electrodes through mechanical mixing with the inorganic component of the composition.

The organic vehicle may include a suitable organic vehicle used in a composition for solar cell electrodes, e.g., a binder resin, a solvent, or the like.

The binder resin may include acrylate resins or cellulose resins. In an implementation, ethyl cellulose may be used as the binder resin. In an implementation, the binder resin may include, e.g., ethyl hydroxyethyl cellulose, nitrocellulose, blends of ethyl cellulose and phenol resins, alkyd, phenol, acrylate ester, xylene, polybutane, polyester, urea, melamine, vinyl acetate resins, wood rosin, polymethacrylates of alcohols, or the like.

In an implementation, the solvent may include, e.g., hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, or ethyl lactate. These may be used alone or as a mixture thereof.

In an implementation, the organic vehicle may be present in an amount of, e.g., about 1 wt % to about 30 wt % based on the total weight of the composition for solar cell electrodes. Within this range, the organic vehicle may help provide sufficient adhesive strength and excellent printability to the composition. In an implementation, the organic vehicle may be present in an amount of, e.g., about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt %, based on the total weight of the composition for solar cell electrodes.

In an implementation, the composition for solar cell electrodes may further include a suitable additive to, e.g., enhance fluidity, process properties and stability, as desired. In an implementation, the additive may include, e.g., a dispersant, a thixotropic agent, a plasticizer, a viscosity stabilizer, an anti-foaming agent, a pigment, a UV stabilizer, an antioxidant, a coupling agent, or the like. These additives may be used alone or as mixtures thereof. In an implementation, the additive may be present in an amount of, e.g., about 0.1 wt % to about 5 wt % based on the total weight of the composition for solar cell electrodes. In an implementation, the additive may be present in an amount of, e.g., about 0.1 wt %, 0.2 wt %, 0.3 wt %, 0.4 wt %, 0.5 wt %, 0.6 wt %, 0.7 wt %, 0.8 wt %, 0.9 wt %, 1 wt %, 1.5 wt %, 2 wt %, 2.5 wt %, 3 wt %, 3.5 wt %, 4 wt %, 4.5 wt %, or 5 wt %, based on the total weight of the composition for solar cell electrodes.

The front electrode having the stepped structure according to an embodiment may be fabricated by applying the composition for solar cell electrodes to a front surface of a substrate, followed by baking. In an implementation, the baking may be performed at a temperature of, e.g., about 600° C. to about 1,000° C. or about 800° C. to about 1,000° C. In an implementation, the front electrode may be fabricated by, e.g., applying the composition for solar cell electrodes (including the glass fit including tellurium) and baking the applied composition at a temperature of about 600° C. to about 1,000° C. for about 30 seconds to about 10 minutes.

In an implementation, the above baking conditions may vary depending on the composition of the composition for solar cell electrodes, e.g., the components of the glass frit, the content of the silver powder, and the like. For example, the melting point and crystallization temperature of silver may vary depending upon the components of the glass frit and the content of silver powder in the composition for solar cell electrodes.

Solar Cell

Next, a solar cell according to an embodiment will be described.

Figure 9:
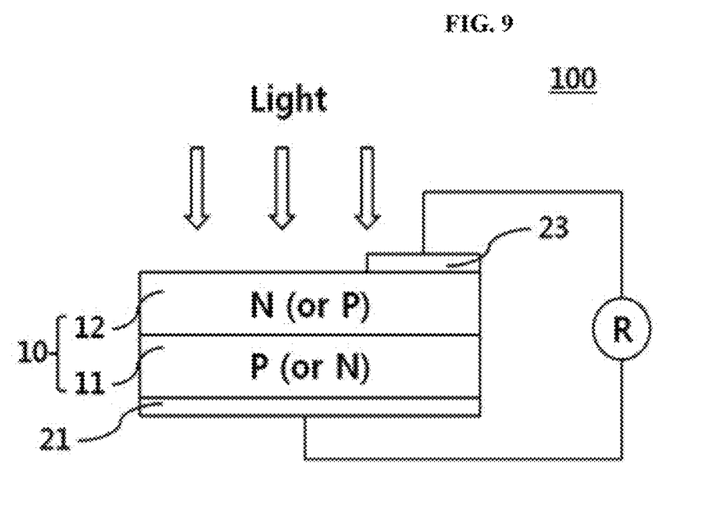
FIG. 9 illustrates a sectional view of a solar cell according to one embodiment.

FIG. 9 is a schematic view of a solar cell according to one embodiment of the present invention.

Referring to FIG. 9, a solar cell according to this embodiment may include a substrate 10, a front electrode 23 on a front surface of the substrate 10, and a rear electrode 21 on a back surface of the substrate 10.

In an implementation, the substrate 10 may be a substrate having a p-n junction formed therein. For example, the substrate 10 may include a semiconductor substrate 11 and an emitter 12. For example, the substrate 10 may be a substrate prepared by doping one surface of a p-type semiconductor substrate 11 with an n-type dopant to form an n-type emitter 12. In an implementation, the substrate 10 may be a substrate prepared by doping one surface of an n-type semiconductor substrate 11 with a p-type dopant to form a p-type emitter 12. In an implementation, the semiconductor substrate 11 may be any one of a p-type substrate and an n-type substrate. In an implementation, the p-type substrate may be a semiconductor substrate 11 doped with a p-type dopant, and the n-type substrate may be a semiconductor substrate 11 doped with an n-type dopant.

In the description of the substrate 10, the semiconductor substrate 11, and the like, a surface of such a substrate on which light is incident may be referred to as a front surface (light receiving surface). In addition, a surface of the substrate opposite the front surface may be referred to as a back surface.

In an implementation, the semiconductor substrate 11 may be formed of crystalline silicon or a compound semiconductor. For example, the crystalline silicon may be monocrystalline or polycrystalline. As the crystalline silicon, e.g., a silicon wafer may be used.

In an implementation, the p-type dopant may be a material including a group III element such as boron, aluminum, or gallium. In an implementation, the n-type dopant may be a material including a group V element, such as phosphorus, arsenic, or antimony.

The front electrode 23 may be fabricated using the composition for solar cell electrodes according to an embodiment. The rear electrode 21 may be fabricated using an aluminum paste. For example, the front electrode 23 may be formed by printing the composition for solar cell electrodes on the front surface of the substrate 10, followed by baking, and the rear electrode 21 may be formed by applying the aluminum paste to the back surface of the substrate, followed by baking. At least a portion of the front electrode 23 may have the stepped structure as described herein.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Details of components used in the following Examples and Comparative Examples are as follows:

(A) Silver Powder

Spherical silver powder having an average particle diameter of 2.0 μm (AG-4-8, Dowa Hightech Co., Ltd.) was used.

(B) Glass Frit (B-1) CTB-06 (Particlogy Co., Ltd.) (containing 8.75 wt % of $TeO_2$)

(B-2) BT-698 (Asahi Glass Co., Ltd.) (containing 66.74 wt % of $TeO_2$)

(B-3) ABT-1 (Asahi Glass Co., Ltd.) (containing 71.43 wt % of $TeO_2$)

(B-4) CI-19 (Particlogy Co., Ltd.) (not include $TeO_2$)
(B-5) CI-37 (Particlogy Co., Ltd.) (not include $TeO_2$)
(B-6) CI-05 (Particlogy Co., Ltd.) (not include $TeO_2$)
(B-7) BL1001 (Particlogy Co., Ltd.) (not include $TeO_2$)

(C) Organic Vehicle

Ethylcellulose (STD4, Dow Chemical Company) was used as an organic binder and Texanol was used as a solvent.

Examples 1 to 3 and Comparative Examples 1 to 4

Components (A) to (C) were sufficiently mixed with one another in amounts as listed in Table 1, followed by mixing and kneading in a 3-roll kneader, thereby preparing a composition for solar cell front electrodes.

TABLE 1

| Unit: wt % | | Example | | | Comparative Example | | | |
|---|---|---|---|---|---|---|---|---|
| | | 1 | 2 | 3 | 1 | 2 | 3 | 4 |
| (A) | | 90 | 90 | 90 | 90 | 90 | 90 | 90 |
| (B) | (B-1) | 2.5 | — | — | — | — | — | — |
| | (B-2) | — | 2.5 | — | — | — | — | — |
| | (B-3) | — | — | 2.5 | — | — | — | — |
| | (B-4) | — | — | — | 2.5 | — | — | — |
| | (B-5) | — | — | — | — | 2.5 | — | — |

TABLE 1-continued

| Unit: wt % | | Example | | | Comparative Example | | | |
|---|---|---|---|---|---|---|---|---|
| | | 1 | 2 | 3 | 1 | 2 | 3 | 4 |
| | (B-6) | — | — | — | — | — | 2.5 | — |
| | (B-7) | — | — | — | — | — | — | 2.5 |
| (C) | | 7.5 | 7.5 | 7.5 | 7.5 | 7.5 | 7.5 | 7.5 |

Property Evaluation (1) Surface structure: The outermost surface of a front electrode formed using each of the compositions of Examples and Comparative Examples was photographed using a scanning electron microscope, followed by measurement of the area occupied by a stepped structure. The occupied area was measured using the Image Pro Plus program (Media Cybernetics, Inc.). Obtained images are shown in FIGS. 2 to 8 and measurement values of the area occupied by the stepped structure are shown in Table 2.

(2) Adhesive strength: Flux was applied to the front electrode formed using each of the compositions of Examples and Comparative Examples and bonded to a ribbon at 300° C. to 400° C. using a soldering iron (Hakko Co., Ltd.). Then, the resultant was evaluated as to adhesive strength (N/mm) at a peeling angle of 180° and a stretching rate of 50 mm/min using a tensioner (Tinius Olsen).

TABLE 2

| | Occupied area (%) | Adhesive strength (N/mm) |
|---|---|---|
| Example 1 | 15 | 3.54 |
| Example 2 | 60 | 4.62 |
| Example 3 | 100 | 5.52 |
| Comparative Example 1 | 0 | 2.31 |
| Comparative Example 2 | 0 | 2.15 |
| Comparative Example 3 | 0 | 2.41 |
| Comparative Example 4 | 4 | 2.89 |

As shown in Table 2, it may be seen that the front electrodes of Examples 1 to 3 (in which the area occupied by the stepped structure was 5% or more) exhibited considerably improved adhesion to a ribbon, as compared with the front electrodes of Comparative Examples 1 to 3 (not including the stepped structure) and the front electrode of Comparative Example 4 (in which the area occupied by the stepped structure was less than 5%).

By way of summation and review, the thickness of an emitter may be reduced in order to increase solar cell efficiency. However, reduction in thickness of the emitter could cause shunting, thereby deteriorating solar cell performance. In addition, the area of a solar cell may be increased in order to achieve high photovoltaic efficiency. However, increase in area of the solar cell could cause deterioration in efficiency through increase in contact resistance thereof.

Figure 10:
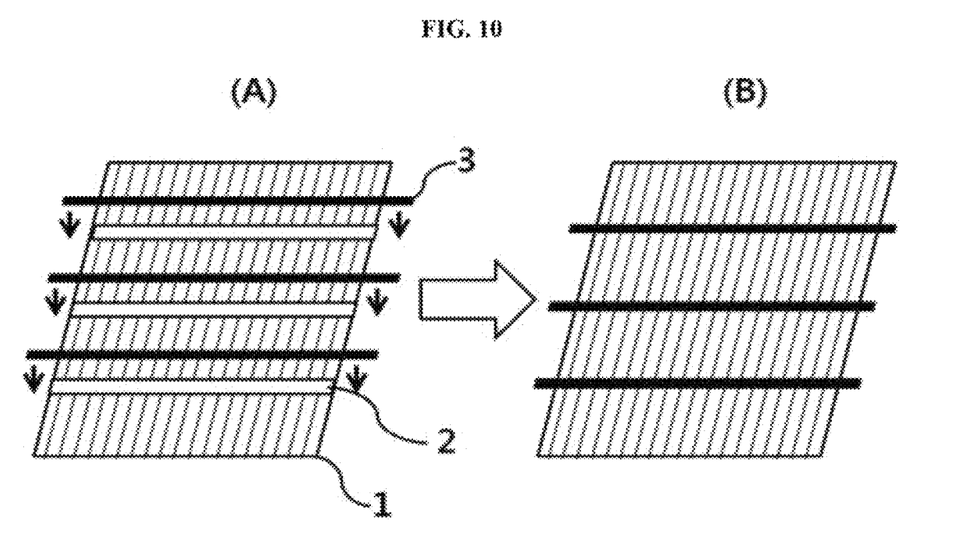
FIG. 10 illustrates a schematic view showing a method of connecting cells of a solar cell to one another through a ribbon.

Referring to FIG. 10, a cell 1 constituting a solar cell may be connected to an adjacent cell through a ribbon 3. The ribbon may be directly bonded to a bus bar acting as an electrode. If adhesion of the electrode to the ribbon were not sufficiently secured, series resistance of the electrode could increase and conversion efficiency of the solar cell could deteriorate. Lead-containing glass frits may be used in an electrode paste for solar cells. Such lead-containing glass frits may cause deterioration in adhesion of the electrode to the ribbon. Adding a material capable of improving adhesion to ribbons, e.g., tungsten oxide, to the electrode paste, may be considered. However, addition of such a material could cause deterioration in electrical properties of a solar cell.

The embodiments may provide a front electrode for solar cells that my exhibit improved adhesion to ribbons without deterioration in solar cell efficiency.

The embodiments may provide a front electrode for solar cells that has a stepped multilayer structure on the outermost surface thereof and that exhibits good adhesion to ribbons connecting cell units of a solar cell to one another.

The embodiments may provide a front electrode for solar cells that may exhibit improved adhesion to a ribbon through control of surface morphology of the electrode.

The embodiments may provide a solar cell that includes the front electrode as set forth above and exhibits good properties in terms of reliability and conversion efficiency.

According to an embodiment, it is possible to provide a front electrode that includes a stepped structure formed on the outermost surface thereof and occupying about 5% to about 100% of the total area of the outermost surface and thus exhibits good adhesion to a ribbon, as compared with another front electrode having an amorphous surface structure. In addition, the embodiments may provide a front electrode that may exhibit improved adhesion through control of surface morphology thereof without adding any component causing deterioration in contact resistance and thus may exhibit good resistance characteristics. Further, the embodiments may provide a solar cell that includes the front electrode as set forth above and thus exhibits good properties in terms of reliability and conversion efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A front electrode for solar cells, the front electrode comprising a stepped structure protruding from a flat outermost surface thereof, wherein:
    the stepped structure consists of n stages, wherein each stage of the stepped structure at least partially includes a prismatic structure in which planar surfaces of the stepped structure meet at an angle, and in which n is an integer of 3 or greater, and an $n^{th}$ stage has a smaller cross-sectional area than an $(n-1)^{th}$ stage such that the $(n-1)^{th}$ stage is partially exposed,
    the stepped structure covers about 5% to about 100% of a total surface area of the front electrode, and
    any sectional view of the stepped structure perpendicular to the outermost surface of the front electrode and passing through a top surface of the nth stage has a stepped profile.

2. The front electrode for solar cells as claimed in claim 1, wherein the stepped structure has a silver content of about 50 wt % to about 100 wt %.

3. The front electrode for solar cells as claimed in claim 1, wherein the composition includes:
    about 60 wt % to about 95 wt % of the silver powder,
    about 0.1 wt % to about 20 wt % of the glass frit, and
    about 1 wt % to about 30 wt % of the organic vehicle.

4. The front electrode for solar cells as claimed in claim 1, wherein the composition further includes a dispersant, a thixotropic agent, a plasticizer, a viscosity stabilizer, an anti-foaming agent, a pigment, a UV stabilizer, an antioxidant, or a coupling agent.

5. The front electrode for solar cells as claimed in claim 1, wherein baking is performed at a temperature of about 600° C. to about 1,000° C.

6. A solar cell comprising the front electrode for solar cells as claimed in claim 1.

7. The front electrode for solar cells as claimed in claim 1, wherein the front electrode is formed by baking a composition that includes silver powder, a glass frit, and an organic vehicle.

8. The front electrode for solar cells as claimed in claim 7, wherein the glass frit includes tellurium.

* * * * *